(12) United States Patent
Ma et al.

(10) Patent No.: US 10,833,216 B2
(45) Date of Patent: Nov. 10, 2020

(54) METAMATERIAL BASED METAL GATE MOSFET DETECTOR WITH GATE RASTERIZED

(71) Applicant: Guangdong University of Technology, Guangzhou (CN)

(72) Inventors: Jianguo Ma, Guangzhou (CN); Shaohua Zhou, Guangzhou (CN)

(73) Assignee: Guangdong University of Technology, Guangzhou (CN)

( * ) Notice: Subject to any disclaimer, the term of this patent is extended or adjusted under 35 U.S.C. 154(b) by 142 days.

(21) Appl. No.: 16/297,693

(22) Filed: Mar. 10, 2019

(65) Prior Publication Data

US 2020/0203550 A1 Jun. 25, 2020

(30) Foreign Application Priority Data

Dec. 24, 2018 (CN) .......................... 2018 1 1581753

(51) Int. Cl.
| | |
|---|---|
| *H01L 31/00* | (2006.01) |
| *H01L 31/113* | (2006.01) |
| *H01L 31/0232* | (2014.01) |
| *G01J 1/44* | (2006.01) |
| *H01L 31/0224* | (2006.01) |

(52) U.S. Cl.
CPC ............ *H01L 31/1136* (2013.01); *G01J 1/44* (2013.01); *H01L 31/02327* (2013.01); *H01L 31/022408* (2013.01); *G01J 2001/4473* (2013.01)

(58) Field of Classification Search
CPC .............. H01L 31/113; H01L 31/1136; H01L 31/0224; H01L 29/12
USPC .................................................... 250/214.1
See application file for complete search history.

(56) References Cited

U.S. PATENT DOCUMENTS

2015/0357504 A1* 12/2015 Chen ..................... H01L 31/028
257/27

* cited by examiner

*Primary Examiner* — Kevin K Pyo

(57) ABSTRACT

The present disclosure discloses a metamaterial based metal gate MOSFET detector with gate rasterized, comprising a metamaterial based metal gate MOSFET having a rasterized gate structure and various different grating pattern forms thereof, wherein a gate of the metal gate MOSFET is connected to a first bias resistor and a first bias voltage, a source of the metal gate MOSFET is grounded, a drain of the metal gate MOSFET is connected to a first DC blocking capacitor, the first DC blocking capacitor is connected to a low noise preamplifier, and a second bias resistor and a second bias voltage are connected between the low noise preamplifier and the first DC blocking capacitor. The technical solution according to the present disclosure can completely absorb terahertz waves of a specific frequency band and generate resonance.

5 Claims, 2 Drawing Sheets

METAMATERIAL BASED METAL GATE MOSFET DETECTOR WITH GATE RASTERIZED

CROSS-REFERENCE TO RELATED APPLICATION

This application claims the priority to Chinese Patent Application No. 201811581753.0 filed on Dec. 24, 2018. The content of the aforementioned application, including any intervening amendments thereto, are incorporated herein by reference.

TECHNICAL FIELD

The present disclosure relates to the field of terahertz technology, and in particular to a metamaterial based metal gate MOSFET detector with gate rasterized.

TECHNICAL BACKGROUND

A Terahertz wave is an electromagnetic wave between microwaves and infrared light on the electromagnetic spectrum, and has a frequency of 0.1 to 10 THz and a wavelength corresponding to 3 mm to 30 µm.

Terahertz technology is one of the frontiers and hotspots of information science and technology research. Recently, it has been widely concerned by research institutions all over the world. Among them, the United States, Japan, Europe and other developed countries have rated terahertz technology as "Top Ten Technologies for Changing the Future World" and "Top Ten Key Strategic Objectives of National Pillar Technologies", and therefore have invested heavily for consolidating their international status in the field of terahertz technology.

Due to its wide application prospects, the terahertz technology can be widely used in astrophysics, materials science, biomedicine, environmental science, spectroscopy and imaging technology, information science and technology, etc.

In the prior art, a terahertz detector, which is the basis of terahertz technology application, is a critical component of terahertz security and detection. However, at present, the terahertz detectors based on the prior art generally have many shortcomings such as slow response speed and low detection sensitivity, which greatly limits the integrated application and development of terahertz technology. Terahertz detection based on a rasterized gate based High Electron Mobility Transistor (HEMT) has proven to be very feasible, but since a HEMT process is not compatible with a CMOS process, a readout circuit and a signal processing circuit of the terahertz detector are basically implemented by the CMOS process. Nowadays, the development trend of terahertz detectors is miniaturization and high integration. Therefore, the development of CMOS-compatible process based terahertz detectors and terahertz sources of room temperature is a current research hotspot in terahertz detection and array imaging for achieving low-cost full integration. One of the biggest differences between HEMTs and conventional MOSFETs is that the HEMTs use metal gates, while the conventional MOSFETs use polysilicon gates. The MOSFET of metal gate has become the mainstream of CMOS since 2014, so the present disclosure innovatively introduces a key point in the HEMT terahertz detector, the rasterized gate, into the MOSFET of metal gate, so that the MOSFET detecting terahertz like the HEMT becomes a reality.

SUMMARY

A main object of the present disclosure is to propose a metamaterial based metal gate MOSFET terahertz detector with gate rasterized, which is intended to improve the response speed and detection sensitivity of a CMOS terahertz detector.

To achieve the above object, the present disclosure proposes a metamaterial based metal gate MOSFET detector with gate rasterized, comprising a metamaterial based metal gate MOSFET having a rasterized gate structure and various different grating pattern forms thereof, wherein a gate of the metal gate MOSFET is connected to a first bias resistor and a first bias voltage for providing DC power supply, a source of the metal gate MOSFET is grounded, a drain of the metal gate MOSFET is connected to a first DC blocking capacitor, the first DC blocking capacitor is connected to a low noise preamplifier, and further a second bias resistor and a second bias voltage for providing DC power supply are connected between the low noise preamplifier and the first DC blocking capacitor.

Preferably, the low noise preamplifier is further connected to a voltage feedback loop.

Preferably, the voltage feedback loop comprises a first resistor connected to two ends of the low noise preamplifier, a left end of the first resistor connected to a negative terminal of the low noise preamplifier is sequentially connected to a second resistor, a second DC blocking capacitor and the ground, and a right end of the first resistor is also sequentially connected to a third DC blocking capacitor and the ground.

Preferably, the grating pattern structure of the metal gate MOSFET is periodically changed in a lateral direction in different types or the same type, and single-column longitudinal grating pattern structures are the same or different.

Preferably, the grating pattern structure of the metal gate MOSFET is non-periodically changed in a lateral direction, and single-column longitudinal grating pattern structures are the same or different.

The technical solution according to the present disclosure has the following advantages over the prior art:

The metamaterial based metal gate MOSFET terahertz detector with gate rasterized according to the technical solution of the present disclosure adopts a silicon-based CMOS process, so that the terahertz detector and a back-end circuit, such as a readout circuit and a signal processing circuit, that connects the terahertz detector, enable high integration and mass production, thereby further reducing the manufacturing cost of the terahertz detector.

The metamaterial based metal gate MOSFET terahertz detector with gate rasterized according to the technical solution of the present disclosure can adjust the absorption band and absorption intensity of corresponding terahertz waves by adjusting the grating structure parameters (width, length, area and pattern form of the grating) and metamaterial parameters (parameters such as structure, size, dielectric layer thickness and dielectric constant of metamaterial), achieving the extension of the response range of the terahertz detector in the terahertz band, improving the detection sensitivity of the terahertz detector, and ultimately achieving a terahertz detection of narrowband or even point frequency.

The metamaterial based metal gate MOSFET terahertz detector with gate rasterized according to the technical solution of the present disclosure adopts a rasterized metal gate structure, so that the enhancement of space energy of a weak terahertz signal to be measured can be realized, and finally the terahertz signal is effectively detected.

The metamaterial based metal gate MOSFET terahertz detector with gate rasterized according to the technical solution of the present disclosure can change the parameters of a metamaterial layer (parameters such as structure, size, dielectric layer thickness and dielectric constant of metamaterial), so that the periodic or non-periodic rasterized structure based on the metamaterial layer has the ability to completely absorb a terahertz wave of a corresponding frequency band. Once the terahertz detector resonates with the terahertz wave of the corresponding frequency band, the resonance response speed thereof belongs to an ultra-high speed response, so that the terahertz detector can generate a response signal in a very short time, greatly improving the response speed of the terahertz detector.

In addition, the metamaterial based metal gate MOSFET terahertz detector with gate rasterized according to the technical solution of the present disclosure does not need to use an antenna, and can effectively avoid the problems such as large loss, low gain and radiation efficiency of the on-chip antenna, and difficulty in verification by DRC design rules.

BRIEF DESCRIPTION OF THE DRAWINGS

In order to more clearly illustrate the technical solutions in embodiments of the present disclosure or the prior art, the accompanying drawings needed to be used in the description of the embodiments or the prior art will be briefly described below. Obviously, the accompanying drawings in the following description are only some embodiments of the present disclosure, and other accompanying drawings can be obtained by ordinary persons skilled in the art from the structures illustrated in these accompanying drawings without any inventive efforts.

DESCRIPTION OF THE REFERENCE NUMERALS

Figure 1:
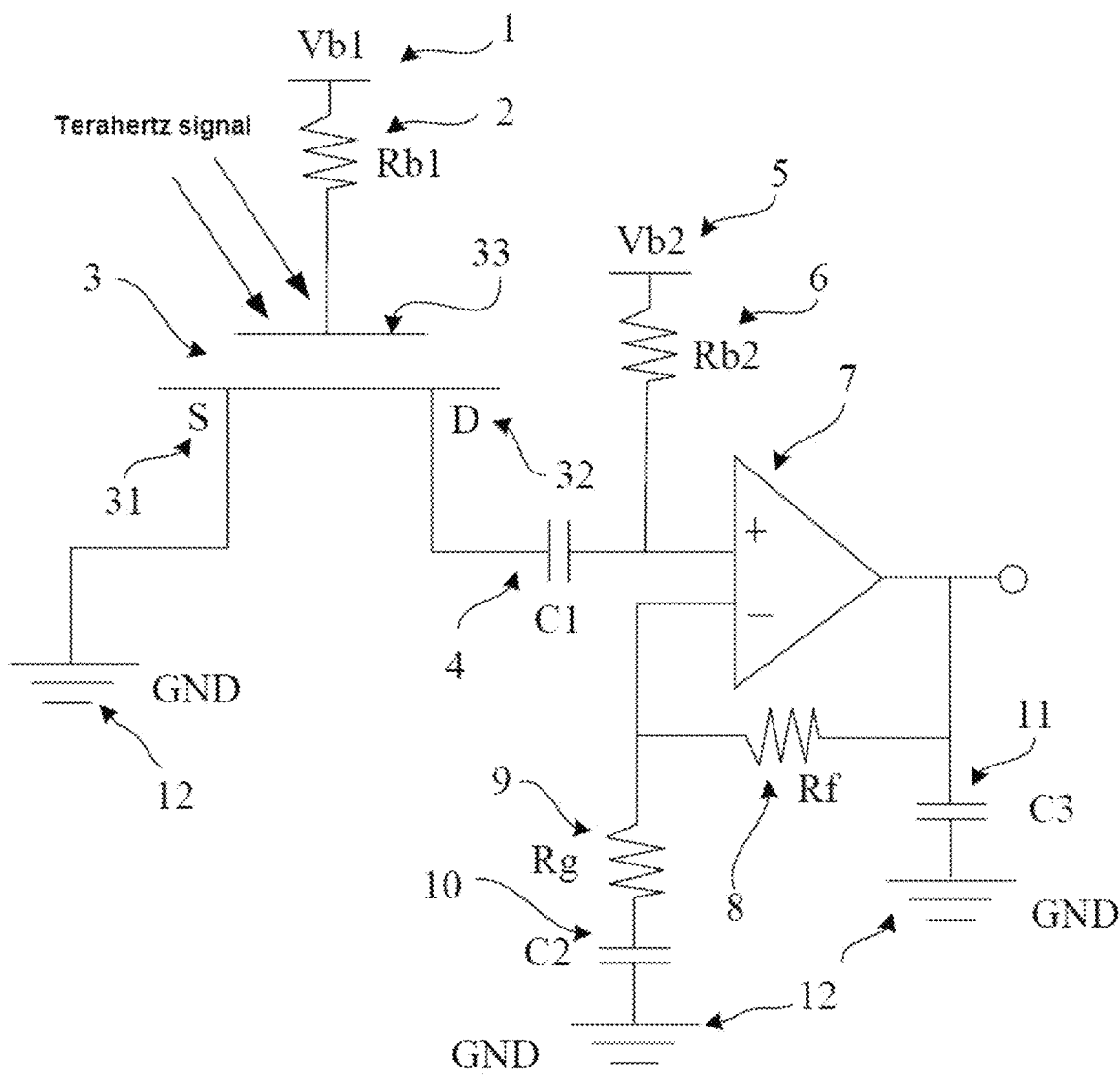
FIG. 1 is a schematic diagram of a circuit structure of a metamaterial based metal gate MOSFET terahertz detector with gate rasterized according to Embodiment 1 of the present disclosure.

| No. | Name |
|---|---|
| 1 | First bias voltage |
| 2 | First bias resistor |
| 3 | Metal gate MOSFET |
| 31 | Source |
| 32 | Drain |
| 33 | Gate |
| 4 | First DC blocking capacitor |
| 5 | Second bias voltage |
| 6 | Second bias resistor |
| 7 | Low noise preamplifier |
| 8 | First resistor |
| 9 | Second resistor |

-continued

| No. | Name |
|---|---|
| 10 | Second DC blocking capacitor |
| 11 | Third DC blocking capacitor |
| 12 | Grounding |

The implementation, functional features and advantages of the present disclosure will be further described in the light of embodiments with reference to the accompanying drawings.

DETAILED DESCRIPTION

The technical solutions according to the embodiments of the present disclosure are clearly and completely described in the following with reference to the accompanying drawings of the embodiments of the present disclosure. Obviously, the described embodiments are only a part of the embodiments of the present disclosure, and not all the embodiments. All other embodiments obtained by ordinary persons skilled in the art based on the embodiments of the present disclosure without creative efforts are within the scope of the present disclosure.

It should be noted that if there is a directional indication (such as up, down, left, right, front, back, . . . ) mentioned in the embodiments of the present disclosure, the directional indication is only used to explain the relative positional relationship between components, motion status, and the like in a specific posture (as shown in the drawing), and if the specific posture changes, the directional indication also changes accordingly.

In addition, if there is a description of "first", "second", etc. in the embodiments of the present disclosure, the description of the "first", "second", etc. is used for the purpose of illustration only, and is not to be construed as an its relative importance or implicit indication of the number of technical features indicated. Thus, the features defined by "first" or "second" may include at least one of the features, either explicitly or implicitly. In addition, the technical solutions among the various embodiments may be combined with each other, but must be based on the enablement of those skilled in the art, and when the combination of the technical solutions is contradictory or impossible to implement, it should be considered that such combination of the technical solutions does not exist, and is not within the scope of protection claimed by the present disclosure.

The present disclosure proposes a metamaterial based metal gate MOSFET terahertz detector with gate rasterized.

Embodiment 1

Figure 2:
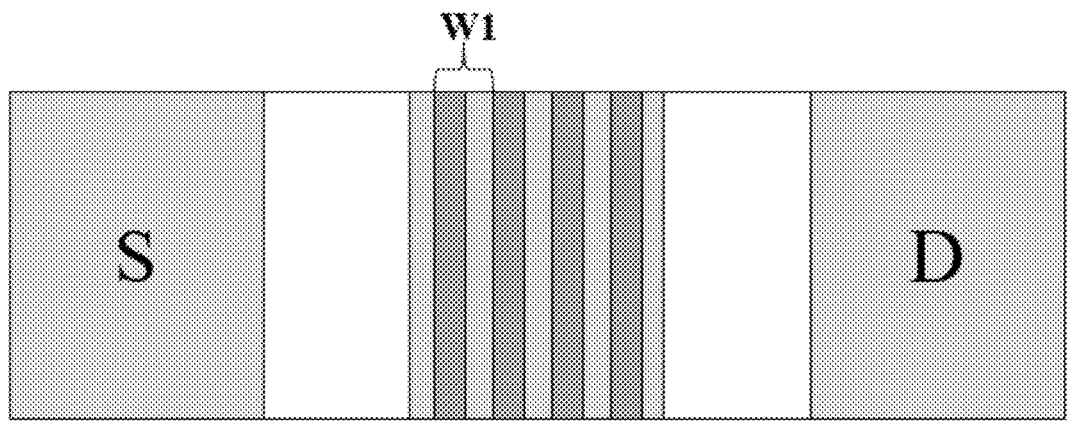
FIG. 2 is a schematic structural view of a rasterized metal gate MOSFET according to Embodiment 1 of the present disclosure.

Referring to FIG. 1 and FIG. 2, in a metamaterial based metal gate MOSFET terahertz detector with gate rasterized according to the embodiment of the present disclosure, one end of a gate 33 of a metal gate MOSFET 3 is connected to a first bias resistor 2, the first bias resistor 2 is connected to a first bias voltage 1, which can accordingly provide DC power supply for the gate 33 of the metal gate MOSFET 3.

A source 31 of the metal gate MOSFET 3 is grounded, a drain 32 of the metal gate MOSFET 3 is connected to a first DC blocking capacitor 4, the first DC blocking capacitor 4 is further connected to a low noise preamplifier 7, a second bias resistor 6 is connected between the low noise preamplifier 7 and the first DC blocking capacitors 4, and the second bias resistor 6 is connected to a second bias voltage 5, so that the low noise preamplifier 7 can be power supplied by the second bias voltage 5 and the second bias resistor 6. In addition, the low noise preamplifier 7 is also electrically connected to a voltage feedback loop. Herein, a left end of a first resistor 8 of the voltage feedback loop of the embodiment is connected to a negative terminal of the low noise preamplifier 7, and a right end of the first resistor 8 is connected to a working terminal of the low noise preamplifier 7. The left end of the first resistor 8 is also sequentially connected to a second resistor 9, a second DC blocking capacitor 10 and the ground 12, and the right end of the first resistor 8 is also connected to a third DC blocking capacitor 11 and the ground 12. By changing the resistance values of the first resistor 8 and the second resistor 9, the gain of the low noise preamplifier 7 can be adjusted.

As shown in FIG. 2, the rasterized metal gate MOSFET 3 of the present embodiment is based on a metamaterial, and its grating pattern structure is periodically alternately changed in a lateral direction and is continuous in a longitudinal direction of a single column. The rasterized metal gate MOSFET 3 of the present embodiment is alternately changed by two different types of grating patterns in the lateral direction, and has only one continuous unit structure in a single column, wherein the period between the two patterns is W1. Therefore, the technical solution according to the present disclosure can adjust the grating structure parameters (such as width, length, area and pattern form of the grating) and metamaterial parameters (parameters such as structure, size, dielectric layer thickness and dielectric constant of metamaterial) of the gate 33 of the metal gate MOSFET 3, so as to adaptively adjust the absorption band and absorption intensity of the corresponding terahertz wave, achieving the extension of the response range of the terahertz detector in the terahertz band, improving the detection sensitivity of the terahertz detector, so that a terahertz detection of narrowband (or even point frequency) can be realized.

At the same time, the output voltage signal of the metamaterial based metal gate MOSFET terahertz detector with gate rasterized according to the embodiment of the present disclosure is a DC voltage signal, and the magnitude of the DC voltage signal is proportional to the radiation intensity of the terahertz signal, so that the intensity information of the incident terahertz signal is obtained according to the magnitude of the output voltage signal of the terahertz detector, thereby realizing terahertz detection.

Embodiment 2

Figure 3:
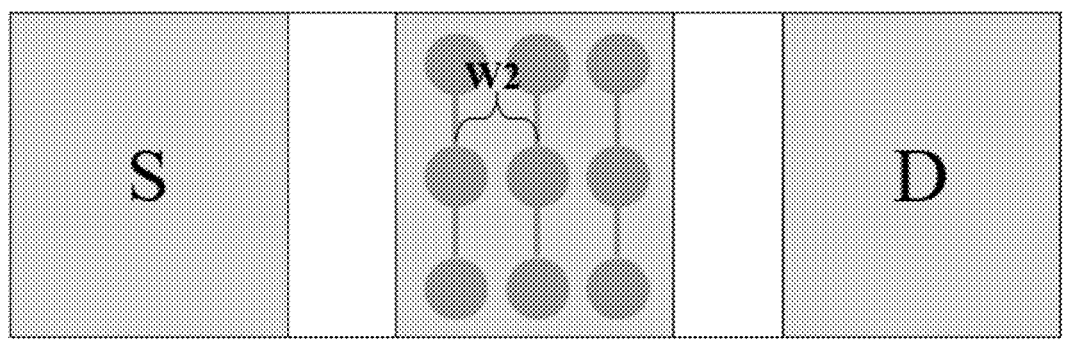
FIG. 3 is a schematic structural view of a rasterized metal gate MOSFET according to Embodiment 2 of the present disclosure.

Referring to FIG. 3, the difference between the present embodiment and Embodiment 1 is that the metal gate MOSFET of this embodiment is based on a metamaterial, and its grating pattern structure is periodically changed in the same unit structure in the lateral direction, and is changed by a plurality of discontinuous identical unit structures in a longitudinal direction of a single column. That is, the grating patterns in each row and in a single column are the same, and at the same time, the period of the grating pattern of each column is W2.

Embodiment 3

Figure 4:
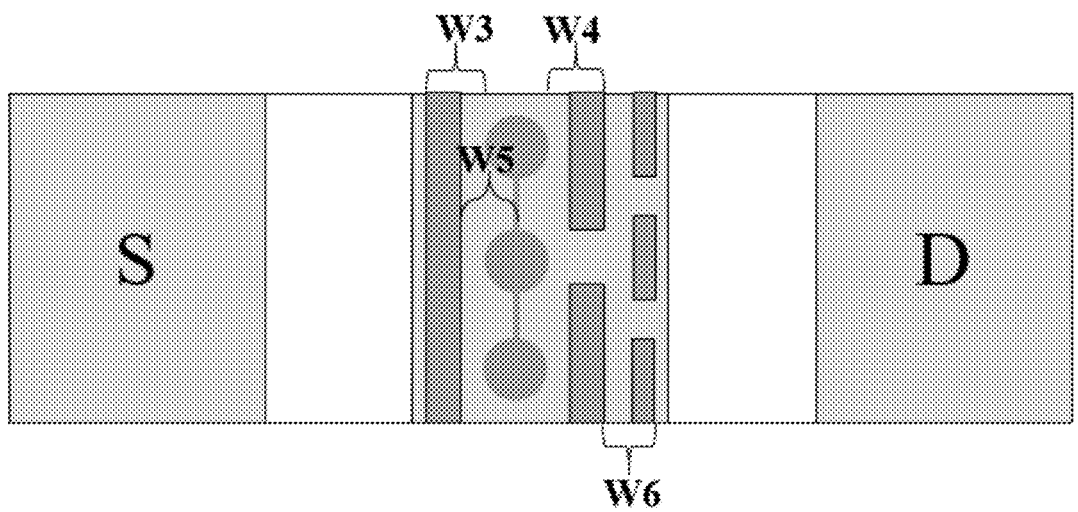
FIG. 4 is a schematic structural view of a rasterized metal gate MOSFET according to Embodiment 3 of the present disclosure.

Referring to FIG. 4, the difference between the present embodiment and Embodiment 2 is that the metal gate MOSFET of this embodiment is based on a metamaterial and the grating pattern structure is non-periodically changed in the lateral direction, but is periodically changed by a single type of pattern in a longitudinal direction of a single column. That is, the grating patterns in the same column are the same pattern. Specifically, the metal gate MOSFET of the present embodiment includes four different grating patterns, and the periods between the four patterns are W3, W4, and W5.

The above is only a preferred embodiment of the present disclosure, which is not intended to limit the scope of the disclosure. All equivalent structural alterations made by using the disclosure of the present specification and drawings, or directly or indirectly utilized in other related technical fields, in the concept of the present disclosure, are encompassed within the scope of patent protection of the present disclosure.

What is claimed is:

1. A metamaterial based metal gate Metal-Oxide-Semiconductor Field-Effect Transistor (MOSFET) detector with gate rasterized comprising a metamaterial based metal gate MOSFET having a rasterized gate structure and various different grating pattern forms thereof, wherein a gate of the metal gate MOSFET is connected to a first bias resistor and a first bias voltage for providing DC power supply, a source of the metal gate MOSFET is grounded, a drain of the metal gate MOSFET is connected to a first Direct Current (DC) blocking capacitor, the first DC blocking capacitor is connected to a low noise preamplifier, and further a second bias resistor and a second bias voltage for providing DC power supply are connected between the low noise preamplifier and the first DC blocking capacitor.

2. The detector of claim 1, wherein the low noise preamplifier is further connected to a voltage feedback loop.

3. The detector of claim 2, wherein the voltage feedback loop comprises a first resistor connected to two ends of the low noise preamplifier, a left end of the first resistor connected to a negative terminal of the low noise preamplifier is sequentially connected to a second resistor, a second DC blocking capacitor and the ground, and a right end of the first resistor is also sequentially connected to a third DC blocking capacitor and the ground.

4. The detector of claim 3, wherein the grating pattern structure of the metal gate MOSFET is periodically changed in a lateral direction in different types or the same type, and single-column longitudinal grating pattern structures are the same or different.

5. The detector of claim 3, wherein the grating pattern structure of the metal gate MOSFET is non-periodically changed in a lateral direction, and single-column longitudinal grating pattern structures are the same or different.

* * * * *